(12) United States Patent
Tang et al.

(10) Patent No.: US 7,800,425 B2
(45) Date of Patent: Sep. 21, 2010

(54) ON-CHIP MODE-SETTING CIRCUIT AND METHOD FOR A CHIP

(75) Inventors: Chien-Fu Tang, Hsinchu (TW); Isaac Y. Chen, Jubei (TW)

(73) Assignee: Richtek Technology Corp., Hsinchu (TW)

( * ) Notice: Subject to any disclaimer, the term of this patent is extended or adjusted under 35 U.S.C. 154(b) by 497 days.

(21) Appl. No.: 11/984,560

(22) Filed: Nov. 20, 2007

(65) Prior Publication Data

US 2008/0122494 A1    May 29, 2008

(30) Foreign Application Priority Data

Nov. 24, 2006  (TW) .............................. 95143587 A

(51) Int. Cl.
*H03K 5/08* (2006.01)
(52) U.S. Cl. .................. 327/313; 327/328; 326/30; 326/86
(58) Field of Classification Search .................. 326/30, 326/86; 327/313, 328, 564; 365/233, 226, 365/193, 233.1
See application file for complete search history.

(56) References Cited

U.S. PATENT DOCUMENTS

| | | | | | |
|---|---|---|---|---|---|
| 4,706,157 | A | * | 11/1987 | Shimazu | 361/86 |
| 5,729,062 | A | * | 3/1998 | Satoh | 307/130 |
| 5,786,719 | A | * | 7/1998 | Furutani | 327/202 |
| 5,818,768 | A | * | 10/1998 | Sawada et al. | 365/193 |
| 5,929,685 | A | * | 7/1999 | Nam | 327/313 |
| 6,215,725 | B1 | * | 4/2001 | Komatsu | 365/233.1 |
| 7,199,653 | B2 | * | 4/2007 | Miyata | 327/564 |

* cited by examiner

*Primary Examiner*—Vibol Tan
(74) *Attorney, Agent, or Firm*—Rosenberg, Klein & Lee

(57) ABSTRACT

An on-chip mode-setting circuit and method are provided for a chip having an output driver with an output terminal connected to a pin of the chip. The pin may be defined between two states from exterior of the chip. The on-chip mode-setting circuit includes an electronic element connected to a bias input of the output driver for producing a voltage when the pin is defined at one of the two states, and a voltage detector for monitoring the voltage to determine which one of the two states the pin is at, and producing a mode-setting signal accordingly.

10 Claims, 5 Drawing Sheets

ON-CHIP MODE-SETTING CIRCUIT AND METHOD FOR A CHIP

FIELD OF THE INVENTION

The present invention is related generally to integrated circuits and, more particularly, to a circuit built in a chip for mode setting of the chip.

BACKGROUND OF THE INVENTION

Many chips such as microprocessors, controllers, memories and other ASICs, need one or more extra pins for setting their operation modes such as normal mode, test mode and others, of their internal circuits from exterior of the chip. The standard approach is to operate exterior circuit to set certain logic levels at such kind of pins, for the detector inside the chip to detect the states at the pins, so as to give the other internal circuits of the chip appropriate instructions, such that the internal circuits will operate in the determined modes corresponding to the detected states at the pins. In this approach, the more operation modes a chip has, the more mode-setting pins it needs.

A method for reducing the number of mode-setting pins is to provide a single pin three possible states, for example, logic '1', logic '0', and high impedance. However, conventional detectors used to detect either logic '1' or logic '0' or, again, high impedance, have the drawback of consuming a large amount of current not only during the detection but also in permanent operation mode. To solve this problem, U.S. Pat. No. 5,198,707 to Nicolai provides a detector built in a chip, which uses a resistor and many switches controlled by many control signals provided by a register and a sequencer.

Using an I/O pin also as a mode-setting pin may reduce the pin number of a chip and thereby lower the cost. However, in this way, it must be carefully not to disturb the logic levels of the I/O pin when not during the mode setting. For example, U.S. Pat. No. 5,539,338 to Moreland provides a selecting circuit built in a chip for selecting between two states and using the same pin as an input and an output.

FIG. 1 shows a circuit during the mode setting of a chip 10 which has an output driver 12 with an output terminal connected to a pin 16. When setting the operation mode of the chip 10, an external circuit 14 is used to connect the pin 16, by two switches, to power supply through a pull-up resistor or to ground through a pull-down resistor. When the pin 16 is used as an output, the switches of the external circuit 14 both turn off, so the output signal produced by the output driver 12 is provided to other external circuits through the pin 16. When the pin 16 is used as an input, a tri-state control signal $S_1$, for example power-on-reset (POR) signal, controls the output driver 12 not to produce any output signal, and so having the output driver 12 as high impedance seen from its output terminal. For this purpose, the interior of the output driver 12 must has an extra impedance switching circuit for switching the operation mode of the output driver 12 in response to the control signal $S_1$. During normal operation, the output driver 12 has extremely low impedance such that current may follow inward from the pin 16. When the pin 16 is defined as an input by the external circuit 14, the output driver 12 is switched by the control signal $S_1$ to high input impedance, and a detector 18 built in the chip 10 will produce a setting signal $S_2$ according to the voltage on the pin 16 for the other internal circuits of the chip 10 to use, such that the internal circuits will operate in different operation mode.

SUMMARY OF THE INVENTION

An object of the present invention is to provide a circuit built in a chip for mode setting of the chip.

According to the present invention, an on-chip mode-setting circuit is provided for a chip having an output driver therein with an output terminal connected to a pin of the chip, which includes an electronic element connected to a bias input of the output driver and a voltage detector within the chip. The pin is defined between two states from exterior of the chip, and the electronic element will produce a voltage when the pin is at one of the two states, such that the voltage detector may determine which of the two states the pin is at by detecting the voltage, and produce a mode-setting signal accordingly.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 2:
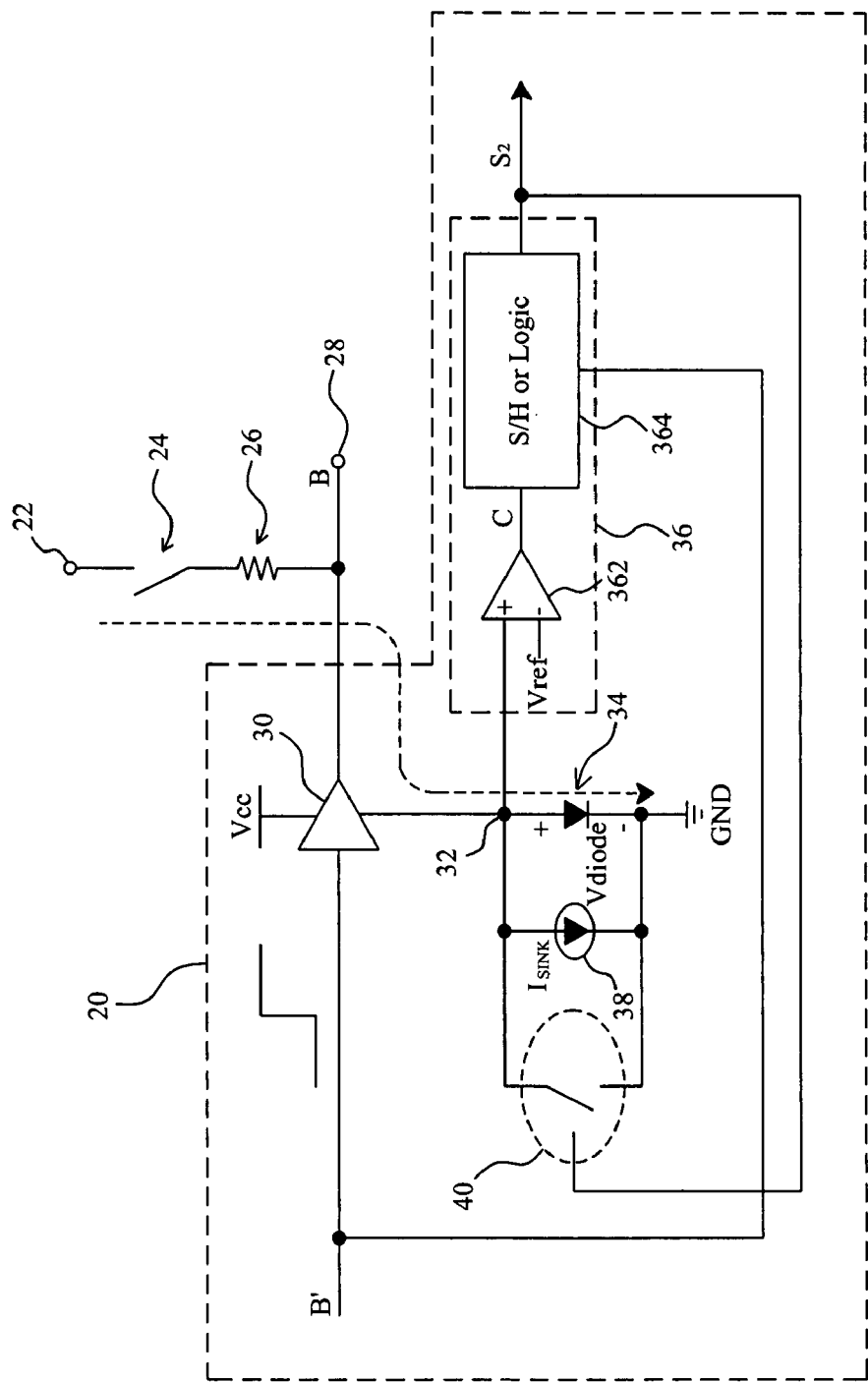
FIG. 2 is a first embodiment according to the present invention.

FIG. 2 shows a first embodiment according to the present invention, in which a chip 20 has an output driver 30 with an output terminal connected to a pin 28 of the chip 20, an external switch 24 and a resistor 26 may connect the pin 28 to a node 22, and the node 22 is connected to power supply or with high level signal. In this embodiment, the node 22 is connected to a power supply Vcc, so the pin 28 will be defined as the state of "connecting to Vcc" or "not connecting to Vcc". Within the chip 20, a diode 34 is connected between a bias input of the output driver 30 and ground GND, such that a current path is built up when the switch 24 is on, and a current may follow from the node 22 toward ground GND through the switch 24, the resistor 26, the pin 28, the output driver 30, and the diode 34, as shown by the dotted line with an arrowhead of FIG. 2, thereby producing a forward voltage Vdiode across the diode 34, and having this voltage Vdiode on the node 32 accordingly. When the switch 24 is off, the above-mentioned current path will be break, and no current will follow through the diode 34, thereby the voltage on the node 32 being zero. If there are still some electric charges staying on the node 32, they will be released to ground GND because of leakage current. Preferably, a current sink 38 is further shunt to the diode 34 for eliminating the electric charges on the node 32, if any, when the switch 24 is off, thereby forcing the voltage on the node 32 to be zero. A voltage detector 36 detects the voltage on the node 32 and accordingly produces a setting signal $S_2$ for the other internal circuits of the chip 20 to use, for example, to instruct them to operate in a certain operation mode.

The voltage detector 36 has a comparator 362 to compare the voltage on the node 32 with a reference Vref to produce a signal C of which the voltage level represents the state at the pin 28. Preferably, the voltage detector 36 further includes a sample-and-hold (S/H) circuit or a logic device (such as a latch) 364 triggered by the signal C, to determine the mode-setting signal $S_2$. The voltage level of the mode-setting signal $S_2$ may be set, for example but not limited to, from the voltage level of a node B'.

Preferably, a switch 40 is further shunt to the diode 34, such that the diode 34 is bypassed when the mode-setting signal $S_2$ turns on the switch 40, thereby forcing the voltage on the node 32 to be zero.

Figure 3:
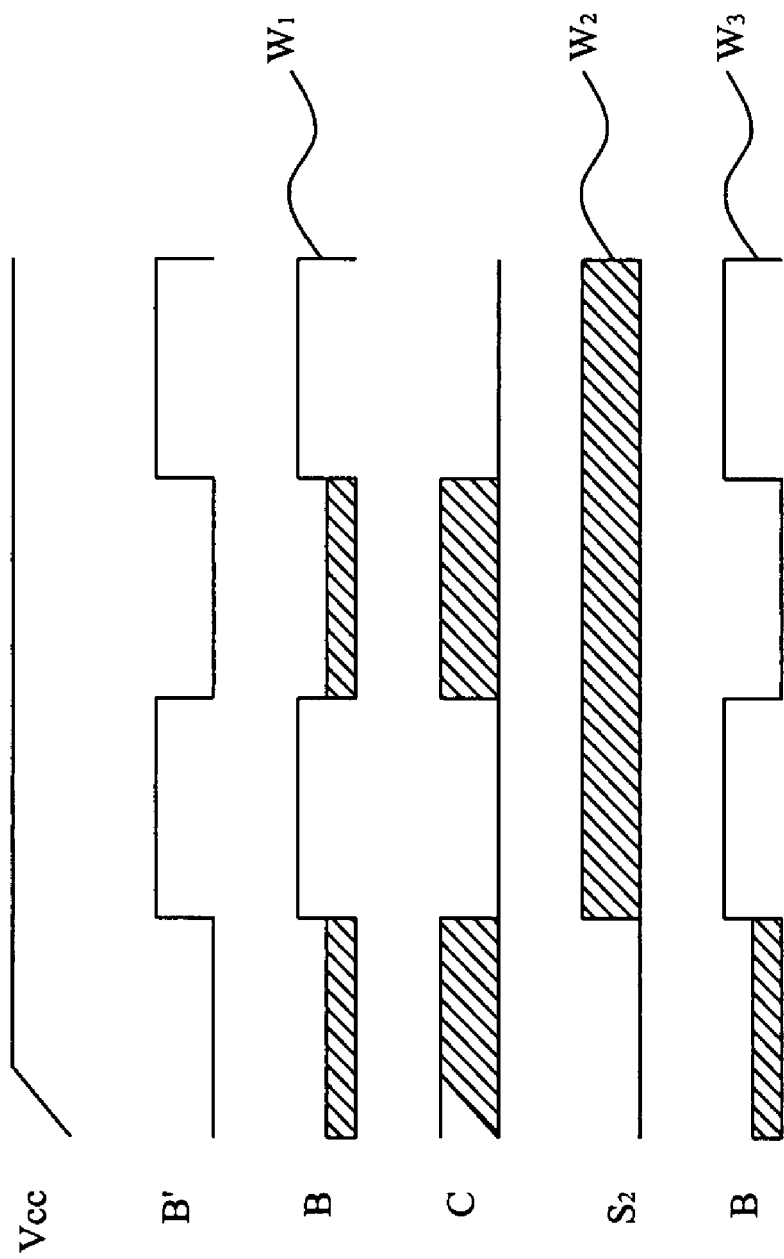
FIG. 3 is a timing diagram of various signals in the circuit shown in FIG. 2.

FIG. 3 is a timing diagram of various signals in the circuit shown in FIG. 2. When the switch 24 is on, the chip 20 produces the signal $S_2$, but not disturbs the output logic of the pin 28. As shown in FIG. 3, when the power on, the supply voltage Vcc rises up from zero to a rated value, and than keeps at this voltage level. If the input of the output driver 30 is active due to the signal B', the output B of the output driver 30 will reflect the logic state of the signal B', only that the low level of the signal B will be increased by the voltage Vdiode, as shown by the waveform $W_1$. In other words, the output signal B is switched between the voltages Vdiode and Vcc. During the output signal B at the low level Vdiode, the output C of the comparator 362 is high; during the output signal B at the high level Vcc, the output C of the comparator 362 is low. In response to the signal C, the S/H circuit or logic device 364 produces the signal $S_2$ having the waveform $W_2$. If the chip 20 includes the switch 40, the output signal B will recover to switch between zero and Vcc once the signal $B_2$ is triggered, as shown by the waveform $W_3$, because the switch 40 is turned on by the active signal $S_2$ to release the residue charges on the node 32.

As mentioned in the above description, since the pin 28 is used as an output and also as an input for mode setting of the chip 20, the chip 20 doesn't need to add any extra mode-setting pin, and the output driver 22 doesn't need to have an extra impedance switching circuit. Moreover, during the mode setting of the chip 20, the output logic of the pin 28 absolutely won't be disturbed. This embodiment shows that the diode 34 is preferred, but a different electronic element also can be used to replace the diode 34 if the output logic of the pin 28 will not be disturbed by the voltage drop across that electronic element.

Figure 4:
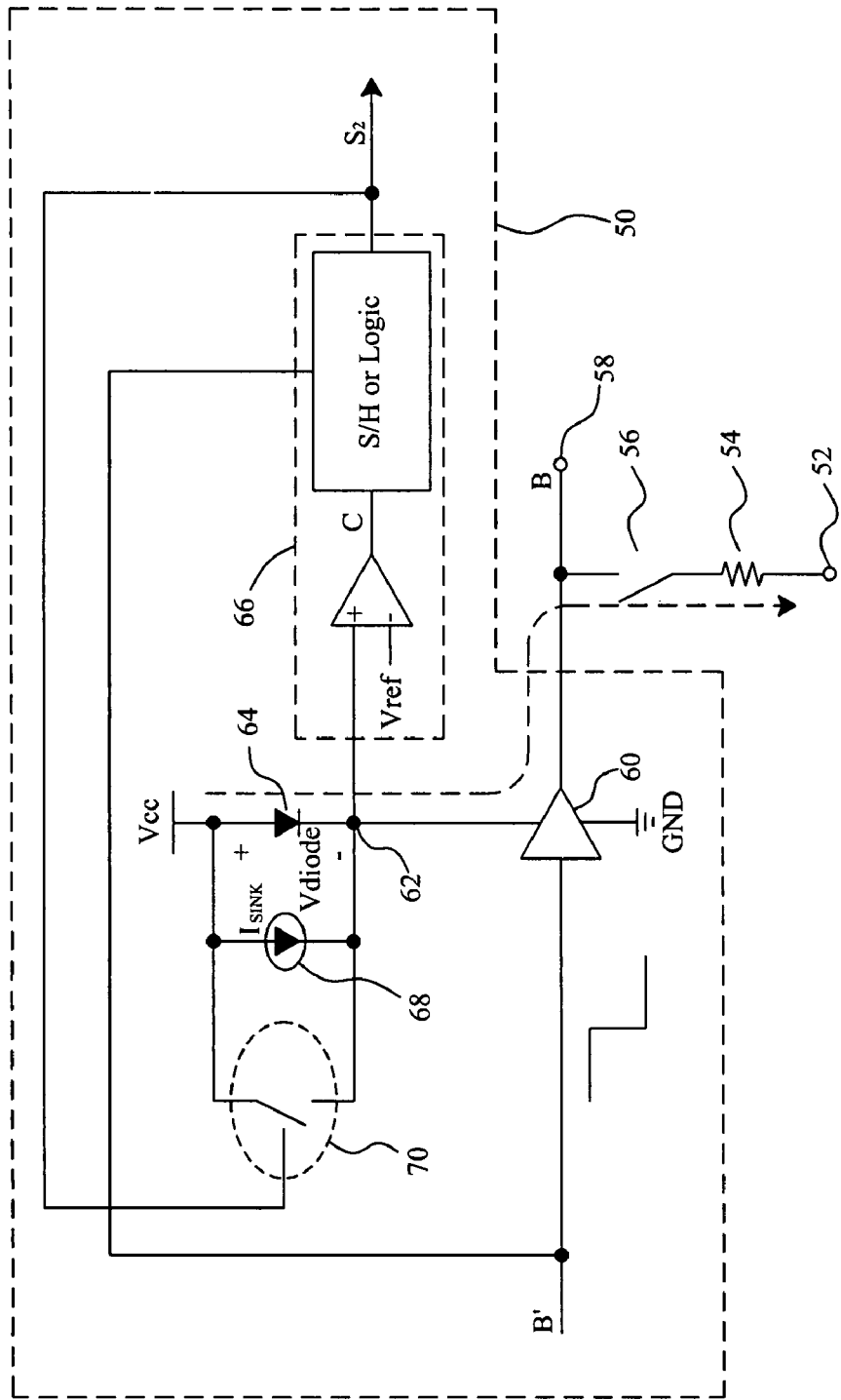
FIG. 4 is a second embodiment according to the present invention.

FIG. 4 is a second embodiment according to the present invention, which has the same elements as those of FIG. 2, with a different configuration from that of FIG. 2. A pin 58 of a chip 50 can be connected to a node 52 through a resistor 54 by switching a switch 56, to define between two states at the pin 58. The node 52 is connected to ground or other low level signal, and in this embodiment, the node 52 is connected to ground. A diode 64 is connected between a bias input of an output driver 60 and a power supply Vcc. If the switch 56 is on, a current path is built up, and current will follow from the power supply Vcc toward the node 52 connected to ground through the diode 64, the output driver 60, the pin 58, the switch 56, and the resistor 54, as shown by the dotted line with an arrowhead of FIG. 4, thereby producing a forward voltage Vdiode across the diode 64, and resulting in the voltage Vcc-Vdiode on a node 62. If the switch 56 is off, the above-mentioned current path will be break, no current will follow through the diode 64, and the voltage on the node 62 will be Vcc. As the same way shown in FIG. 2, a voltage detector 66 detects the voltage on the node 62 and produces a mode-setting signal $S_2$ accordingly.

If a current sink 68 is shunt to the diode 64, it will make the node 62 to have the voltage Vcc when the switch 56 is off.

Further, if a switch 70 is shunt to the diode 64, the diode 64 will be bypassed when the switch 70 is turned on by the mode-setting signal $S_2$, resulting in the voltage on the node 62 being Vcc.

Figure 5:
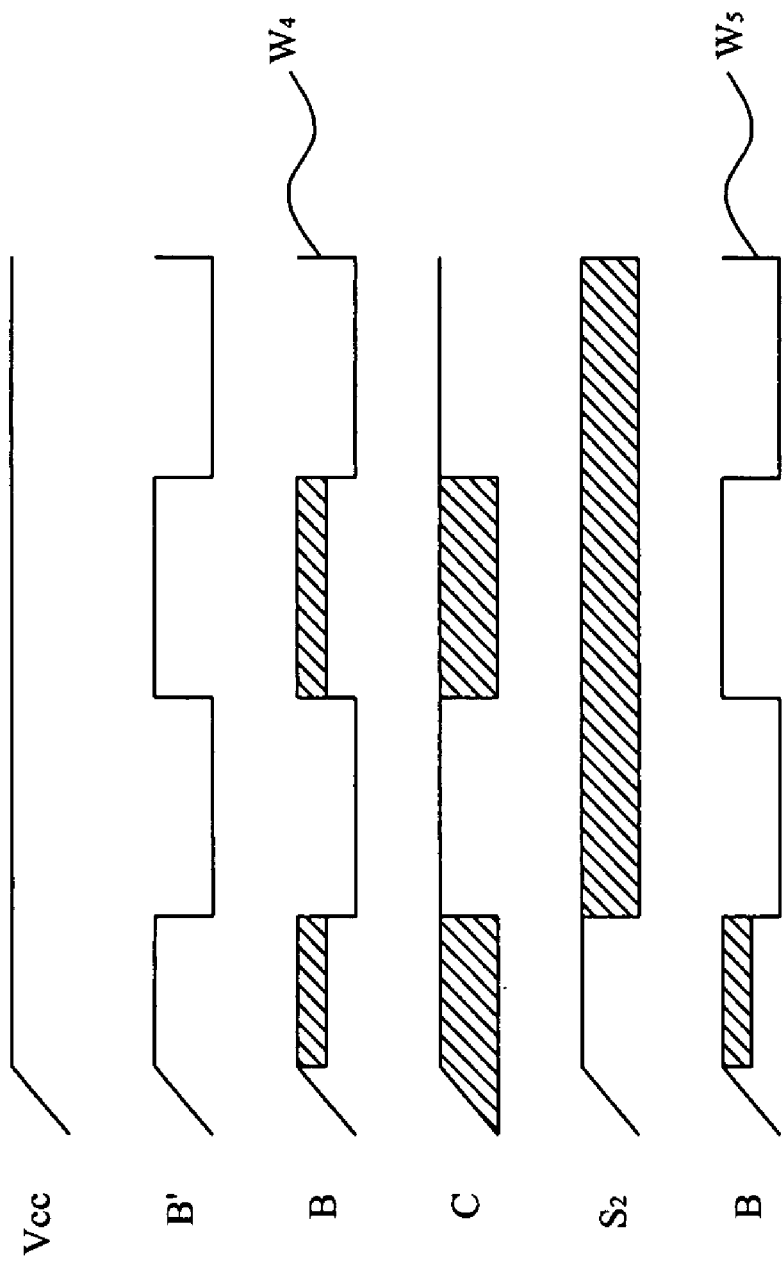
FIG. 5 is a timing diagram of various signals in the circuit shown in FIG. 4.

FIG. 5 is a timing diagram of various signals in the circuit shown in FIG. 4, which is similar to that of FIG. 4, only that the logic levels are different. When power on, the supply voltage Vcc raises up from zero to a rated value, so the input B' of the output driver 60 also rises up from zero to high level. Because the switch 56 is on, the high level of the output signal B on the pin 58 is Vcc-Vdiode, and thus the signal B is switched between zero and Vcc-Vdiode, as shown by the waveform $W_4$, but has the same logic state as the input signal B', i.e., the output logic at the pin 58 will not be disturbed. In another situation, if the chip 50 includes the switch 70, the output signal B will recover to switch between zero and Vcc once the signal $S_2$ is triggered, as shown by the waveform $W_5$, because the switch 70 is turned on by the active signal $S_2$.

Figure 1:
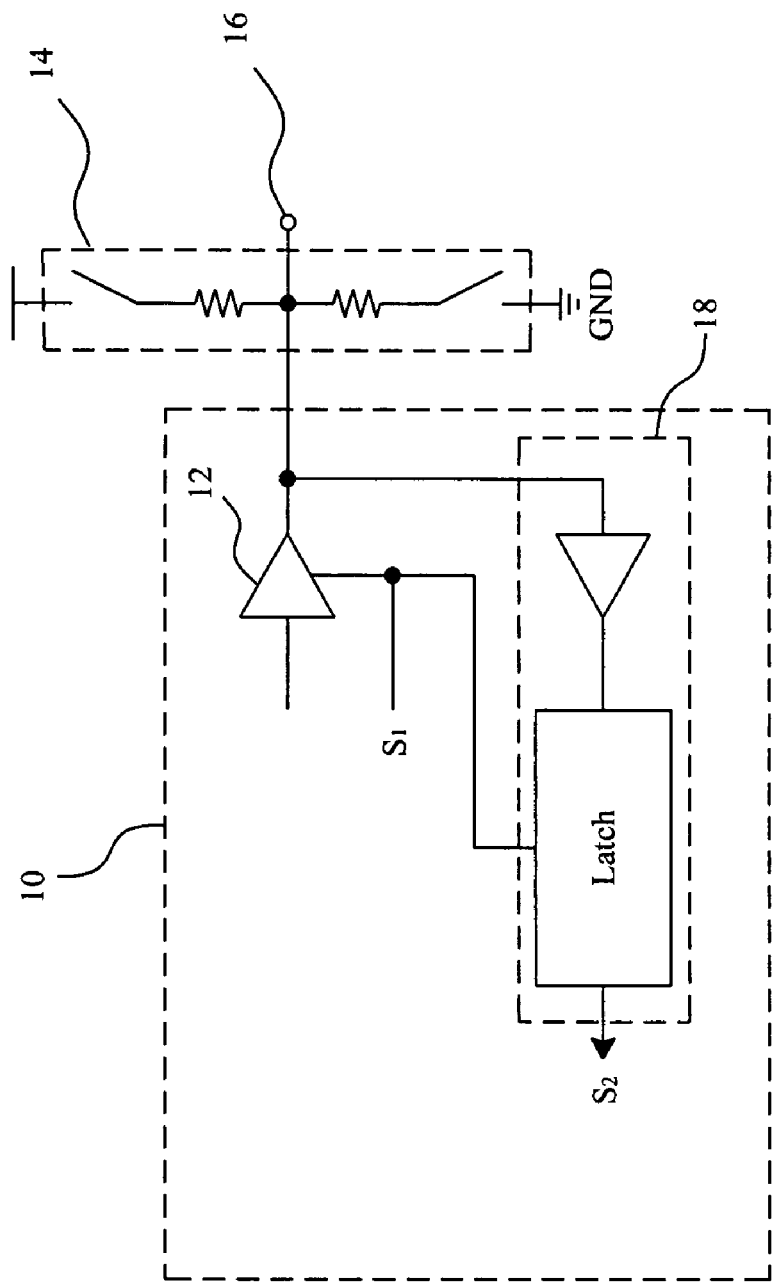
FIG. 1 shows a conventional circuit during the mode setting of a chip.

As shown in the foregoing two embodiments, the signal for controlling a pin to be as a mode-setting pin is hidden. That is to say, according to the present invention, it does not need this kink of control signal (e.g., the control signal $S_1$ of FIG. 1) to switch the output driver to be high impedance.

In practical applications, some pins of a chip cannot have high impedance before power on reset. Since the circuit and method according to the present invention will not disturb the output logic at the pins, even before power on reset, the applications of the present invention will not be restricted.

It is further noted that the electronic elements and configurations shown in the foregoing embodiments are only for illustrating the principle of the present invention, but not intend to limit thereto. Many alternatives, modifications and variations will be apparent to those skilled in the art. For example, between the shown electronic elements, there may be inserted other electronic elements such as driving gates, if they will not influence the primary functions of the circuits. Accordingly, it is intended to embrace all such alternatives, modifications and variations that fall within the spirit and scope thereof as set forth in the appended claims.

What is claimed is:

1. An on-chip mode-setting circuit for a chip having an output driver therein with an output terminal connected to a pin of the chip, the pin being defined between two states from exterior of the chip, the on-chip mode-setting circuit comprising:

an electronic element connected to a bias input of the output driver for producing a voltage when the pin is defined at one of the two states; and a voltage detector for detecting the voltage to thereby produce a mode-setting signal.

2. The on-chip mode-setting circuit of claim 1, wherein the electronic element is a diode.

3. The on-chip mode-setting circuit of claim 1, further comprising a current sink shunt to the electronic element, such that the voltage will be substantially zero when the pin is at the other one of the two states.

4. The on-chip mode-setting circuit of claim 1, wherein the voltage detector comprises a comparator for comparing the voltage with a reference, so as to determine which one of the two states the pin is at.

5. The on-chip mode-setting circuit of claim 4, wherein the voltage detector further comprises a sample-and-hold circuit or logic device, for producing the mode-setting signal based on an output of the comparator.

6. The on-chip mode-setting circuit of claim 1, further comprising a switch shunt to the electronic element, for being turned on by the mode-setting signal when the pin is at the other one of the two states, so as to bypass the electronic element.

7. A mode-setting method for a chip having an output driver therein with an output terminal connected to a pin of the chip, the method comprising the steps of:
  connecting an electronic element to a bias input of the output driver;
  defining the pin between two states from exterior of the chip;
  producing a voltage by the electronic element when the pin is defined at one of the two states;
  monitoring the voltage; and
  producing a mode-setting signal according to the voltage.

8. The method of claim 7, further comprising the step of making the voltage to be substantially zero when the pin is at the other one of the two states.

9. The method of claim 7, wherein the step of monitoring the voltage comprises the step of comparing the voltage with a reference, for determining which one of the two states the pin is at.

10. The method of claim 7, further comprising the step of bypassing the electronic element when the pin is at the other one of the two states.

* * * * *